(12) United States Patent
Worley et al.

(10) Patent No.: US 7,864,597 B2
(45) Date of Patent: Jan. 4, 2011

(54) METHOD AND CIRCUIT FOR CONTROLLING GENERATION OF A BOOSTED VOLTAGE IN DEVICES RECEIVING DUAL SUPPLY VOLTAGES

(75) Inventors: James Leon Worley, Flower Mound, TX (US); Ronald T. Taylor, Grapevine, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/999,785

(22) Filed: Nov. 29, 2004

(65) Prior Publication Data

US 2006/0114739 A1 Jun. 1, 2006

(51) Int. Cl.
*G11C 5/14* (2006.01)
(52) U.S. Cl. .............................. 365/189.09; 365/189.11
(58) Field of Classification Search ............ 365/189.09, 365/189.11, 222, 149, 226
See application file for complete search history.

(56) References Cited

U.S. PATENT DOCUMENTS

| | | | |
|---|---|---|---|
| 5,404,330 A * | 4/1995 | Lee et al. ................ | 365/189.11 |
| 5,483,486 A | 1/1996 | Javanifard et al. | |
| 5,726,944 A | 3/1998 | Pelley, III et al. | |
| 5,864,508 A | 1/1999 | Takashima et al. | |
| 6,335,900 B1 | 1/2002 | Kwon et al. | |
| 6,339,547 B1 * | 1/2002 | Roohparvar ........... | 365/185.18 |
| 6,373,753 B1 | 4/2002 | Proebsting | |
| 6,414,862 B1 | 7/2002 | Ogura | |
| 6,421,295 B1 | 7/2002 | Mao et al. | |
| 6,469,942 B1 | 10/2002 | Kurihara | |
| 6,535,424 B2 | 3/2003 | Le et al. | |
| 6,614,254 B2 | 9/2003 | Tamaki | |
| 7,085,190 B2 | 8/2006 | Worley et al. | |
| 2002/0126560 A1 * | 9/2002 | Cowles et al. ................ | 365/222 |
| 2002/0159301 A1 * | 10/2002 | Ellis et al. .............. | 365/189.09 |
| 2003/0021152 A1 | 1/2003 | Le et al. | |
| 2006/0114739 A1 * | 6/2006 | Worley et al. .......... | 365/230.06 |

OTHER PUBLICATIONS

European Patent Office, European Search Report, Dec. 20, 2006, Application No. EP 05 25 5743, 2 pp.
European Patent Office, European Search Report, Jun. 22, 2007, Application No. EP 05 25 7311, 2 pp.

* cited by examiner

*Primary Examiner*—VanThu Nguyen
*Assistant Examiner*—Douglas King
(74) *Attorney, Agent, or Firm*—Lisa K. Jorgenson; Bryan A. Santarelli

(57) ABSTRACT

A row driver circuit receives a first supply voltage and a second supply voltage. The circuit provides the first supply voltage on an output responsive to the first supply voltage being greater than a threshold value. The circuit generates a boosted voltage that is greater than the first supply voltage and provides that boosted voltage on the output responsive to the first supply voltage being less than the threshold value.

30 Claims, 6 Drawing Sheets

METHOD AND CIRCUIT FOR CONTROLLING GENERATION OF A BOOSTED VOLTAGE IN DEVICES RECEIVING DUAL SUPPLY VOLTAGES

TECHNICAL FIELD

Embodiments of the present invention relate generally to integrated circuits, and more specifically to the generation of voltages for use in integrated circuits.

BACKGROUND OF THE INVENTION

FIG. 1 is a schematic block diagram of a portion of a conventional memory-cell array 100 for a dynamic random access memory (DRAM). The memory-cell array 100 includes a number of memory cells 102 arranged in rows and columns, each memory cell including an access switch in the form of an NMOS access transistor 104 and a storage element in the form of a capacitor 106. The capacitor 106 includes a first plate that receives a reference potential which is typically equal to approximately a supply voltage Vdd divided by two (Vdd/2), with the first plate typically being common to the first plates of all other capacitors in the array 100. A second plate of the capacitor 106 is connected to the source of the transistor 104. Each of the memory cells 102 stores a single bit of binary data in the form of a charge stored on and thus a voltage across the capacitor 106. A voltage of approximately Vdd at the second plate of the capacitor 106 corresponds to a first binary data value and a voltage of approximately zero volts at the second plate corresponds to a second binary data value.

The memory cells 102 are arranged in n rows and m columns, with one memory cell positioned at the intersection of each row and column. Each row of memory cells 102 has an associated word line WL0-WLN-1 and each column of memory cells has an associated pair of true and complementary bit lines BL0, BL0*-BLM-1, BLM-1*, where the "*" indicates that data on the complementary bit line is the complement of data on the associated true bit line, as will be appreciated by those skilled in the art. The bit lines may be referred to generally as BL, BL* and the word lines as WL in the following description. Each memory cell 102 in a given row of memory cells has a control terminal in the form of the gate of the transistor 104 connected to the associated word line WL0-WLN-1 and each memory cell in a given column of memory cells has a data terminal in the form of a drain terminal of the transistor 104 connected to one of the associated complementary bit lines BL0, BL0*-BLM-1, BLM-1*.

Each pair of bit lines BL,BL* is connected to a corresponding sense amplifier 108 that senses and stores data in an addressed memory cell 102 connected to one of the corresponding bit lines. In the simplified diagram of FIG. 1, each sense amplifier is assumed to include isolation transistors for selectively coupling and decoupling the sense amplifier from the corresponding bit lines BL, BL* and equilibration transistors connected between the pair of bit lines for driving or "equilibrating" the bit lines to equal voltages when activated.

In operation of the memory-cell array 100, before data is read from the memory cells 102, control circuitry (not shown) in the DRAM executes an equilibration cycle. During the equilibration cycle, row drivers in the control circuitry drive each of the word lines WL low, turning OFF each access transistor 104 and thereby deselecting each of the memory cells 102. At the same time, each sense amplifier 108 equilibrates the associated bit lines BL, BL* to equalize the voltage on each bit line to approximately Vdd/2. After the equilibration cycle, the row driver of the word line WL corresponding to the addressed memory cells 102 is initially driven with the supply voltage Vdd. In response to the voltage Vdd on the activated word line WL, the access transistors 104 in each memory cell 102 connected to that word line are turned ON and charge is transferred between each capacitor 106 and the associated bit line BL, BL*. For example, if the word line WL0 is activated charge is transferred between the capacitors 106 in each memory cell 102 connected to this word line and the associated complementary bit lines BL0*-BLM-1*.

This charge transfer results in the voltages on each of the complementary bit lines BL0*-BLM-1* either increasing slightly above or decreasing slightly below the equilibrated voltage of Vdd/2, depending on the logic state of data stored in the corresponding memory cell 102. Each sense amplifier 108 then compares the voltage on the complementary bit line BL, BL* connected to the activated memory cell 102 to the voltage of Vdd/2 on the other bit line. In response to the sensed voltage differential between each pair of bit complementary lines BL and BL*, each sense amplifier 108 drives the higher bit line to approximately Vdd and drives the lower bit line to approximately zero volts. The voltage levels on each pair of bit lines BL, BL* now represents the binary value of the data stored in the activated memory cell 102 in that column of memory cells. The data contents of the addressed memory cells 102 are then read from each sense amplifier 108 connected to a column of an addressed memory cell by read/write circuitry (not shown in FIG. 1).

To sense the data stored in each memory cell 102 during a read operation, the row drivers drive each word line WL to the supply voltage Vdd as just described. Because this operation results in charge being transferred from the capacitor 106 in each activated memory cell 102 to the corresponding bit line BL, BL*, the charge stored in the capacitors must be restored to its initial value so that the data initially stored in each memory cell is not destroyed by the read operation. Accordingly, after the data stored in the addressed memory cells has been sensed, the row drivers drive each word line WL with a pumped voltage Vpp that is greater than the supply voltage Vdd. This enables the storage capacitors 106 to be charged to the full supply voltage Vdd when binary data corresponding to this voltage level is to be stored in the memory cell 102. More specifically, to enable the access transistors 104 in each memory cell 102 to charge the capacitor 106 to the full voltage Vdd on the associated bit line BL, BL* the voltage on the word line WL applied to the gate of that transistor must be greater than the voltage Vdd. This is true because to remain turned ON, each transistor 104 must have a gate-to-source voltage that is greater than a threshold voltage VT required to keep the transistor turned ON. This threshold voltage VT is shown for the memory cell 102 in row 0 and column 0 in the array 100 and corresponds to the voltage between the capacitor 106 and the word line WL0 as shown in FIG. 1. Thus, to remain turned ON to charge the capacitor 106 to the full supply voltage Vdd, the pumped voltage Vpp on the word line WL0 must be greater than the supply voltage Vdd by at least the threshold voltage VT (Vpp>Vdd+VT). Note that many in many conventional arrays 100 the word lines WL are simply either held low to deselect the corresponding memory cells or are driven to the pumped supply voltage Vpp to sense and restore data stored in the cells, without the intervening application of the supply voltage Vdd.

The operation of the array 100 during a write operation is similar. Write data is transferred through a read/write data path (not shown) and applied to the respective bit lines BL, BL* of addressed memory cells 102, driving the voltages on pairs of bit lines to complementary voltage levels corresponding to the write data. Thus, for each pair of bit lines BL, BL*, one bit line is driven to Vdd and one is driven to zero volts. To apply the full voltage Vdd to the storage capacitor 106 in an addressed memory cell 102 when required, the word line WL of the row containing the addressed memory cell must be driven to pumped voltage Vpp as previously described. This allows the full values of the voltages on the bit lines BL, BL* corresponding to the write data to be applied through the access transistors 104 to the capacitors 106 in each addressed memory cell 102 and thereby store charge in each capacitor corresponding to a bit of the write data.

The pumped voltage Vpp required for proper operation of the DRAM array 100 may be generated in variety of different ways. A charge pump (not shown) in the DRAM containing the memory-cell array 100 typically generates the pumped voltage Vpp from the supply voltage Vdd, as will be appreciated by those skilled in the art. Alternatively, in some situations the pumped voltage Vpp may be available as a separately provided external supply voltage that may then simply be applied to the array 100 as required. For example, availability of dual power supplies, namely Vdd and Vpp, is common in many application specific integrated circuits (ASICs) where the low supply voltage Vdd powers the memory-cell array 100 and associated peripheral and logic circuitry while the pumped supply voltage Vpp powers other circuitry such as bipolar components. In this situation, the pumped voltage Vpp being generated for the bipolar components may be applied to the array 100 without the need for a charge pump or other voltage increasing circuit if Vpp>Vdd+VT as previously described. If the available voltage Vpp is not greater than Vdd+VT, then a charge pump, boost circuit, or some other suitable circuit is used to increase the voltage Vpp to the required level. A charge pump is a circuit that continuously provides an increased voltage Vpp while a boost circuit utilizes capacitors to provide the increased voltage Vpp only when needed, as will be understood by those skilled in the art.

In the situation where the supply voltages Vdd and Vpp are provided by independent external supply voltages, situations can arise where the pumped voltage Vpp has a value that is higher than required for proper operation of the DRAM array 100. This can occur whether the externally supplied voltage Vpp is applied directly or where the voltage Vpp is increased through a charge pump or boost circuit to the required level. An example of such a situation is where the supply voltage Vpp has a maximum value with a permissible operating range and the supply voltage Vdd has a minimum value with a permissible operating range. For example, assume nominal values for the voltages Vpp and Vdd are 4.2 volts and 3.3 volts, respectively, and that the tolerance or permissible operating range of each is plus or minus 10%. In this situation, assuming a threshold voltage VT of 0.7 volts for the access transistors 104 in the array 100, then Vpp>Vdd+VT (4.2v>3.3v+0.7v) so no increase in the voltage Vpp is required. Now assume the pumped supply voltage Vpp is at its minimum permissible value of 3.78 volts (4.2v−0.42v) and the supply voltage Vdd is at its maximum permissible value of 3.63v (3.3v+0.33v). In this situation, the pumped supply voltage Vpp is no longer greater than the supply voltage Vdd by the required amount, namely 3.78v is not greater than 3.63v+ 0.7v=4.33v. The pumped voltage Vpp needs to be increased to ensure proper operation in this situation. This example illustrates why the supply voltage Vpp is typically increased through a charge pump or boost circuit to ensure that Vpp always has a magnitude great enough to ensure proper operation.

These examples illustrate that as the independent supply voltages Vpp and Vdd vary over time or with changes in temperature, situations can occur where sometimes increasing the pumped voltage Vpp is necessary while in other situations it is not. As a result, conventional ASICs increase the pumped voltage Vpp, typically through a charge pump or boost circuit, above some minimum required to ensure that the pumped voltage always has a sufficient value to ensure proper operation of the DRAM portion of the ASIC. This ensures proper operation of the DRAM portion of the ASIC but places stresses on components in the array 100 and other components in the DRAM portion when the voltage Vpp is increased even though not required for proper operation. The first example above illustrates a situation where increasing is not required for proper operation, namely where the pumped supply voltage Vpp equals 4.2 volts and the supply voltage Vdd equals 3.3 volts. In this situation, no increase in the voltage Vpp is required. With the conventional approach, however, the pumped voltage Vpp of 4.2 volts is nonetheless increased to a higher value, such as 5 volts for example. This results in 5 volts being applied on each activated word line WL and 3.3 volts being applied on the bit lines BL, BL*. As a result, the gate-to-source voltage of the access transistors 104 is 1.7 volts or about 1 volt greater than the required 0.7 volts. Moreover, when a logic zero is being stored in a memory cell 102 the gate-to-source voltage for the corresponding access transistor 104 is 5 volts (i.e., 5 volts on the word line WL and zero volts on the source and drain).

Higher voltages across components in the memory-cell array 100 such as the NMOS transistors 104 stress these components and can thereby damage and reduce the operable life of such components, which reduces the operational life of the ASIC containing the DRAM. This is true, for example, because higher voltages break down oxide layers in such components, such as the oxide layer formed between the gate and a channel region of each access transistor 104.

There is a need for a circuit and method of providing increased voltages in DRAMs and other integrated circuit devices that are great enough to ensure proper operation of the devices but not too large so as to reduce the operational lives of such devices.

SUMMARY OF THE INVENTION

According to one embodiment of the present invention, a row driver circuit receives a first supply voltage and a second supply voltage. The circuit provides the first supply voltage on an output responsive to the first supply voltage being greater than a threshold value. The circuit generates a boosted voltage that is greater than the first supply voltage and provides that boosted voltage on the output responsive to the first supply voltage being less than the threshold value.

DETAILED DESCRIPTION OF PREFERRED EMBODIMENTS

Figure 2:
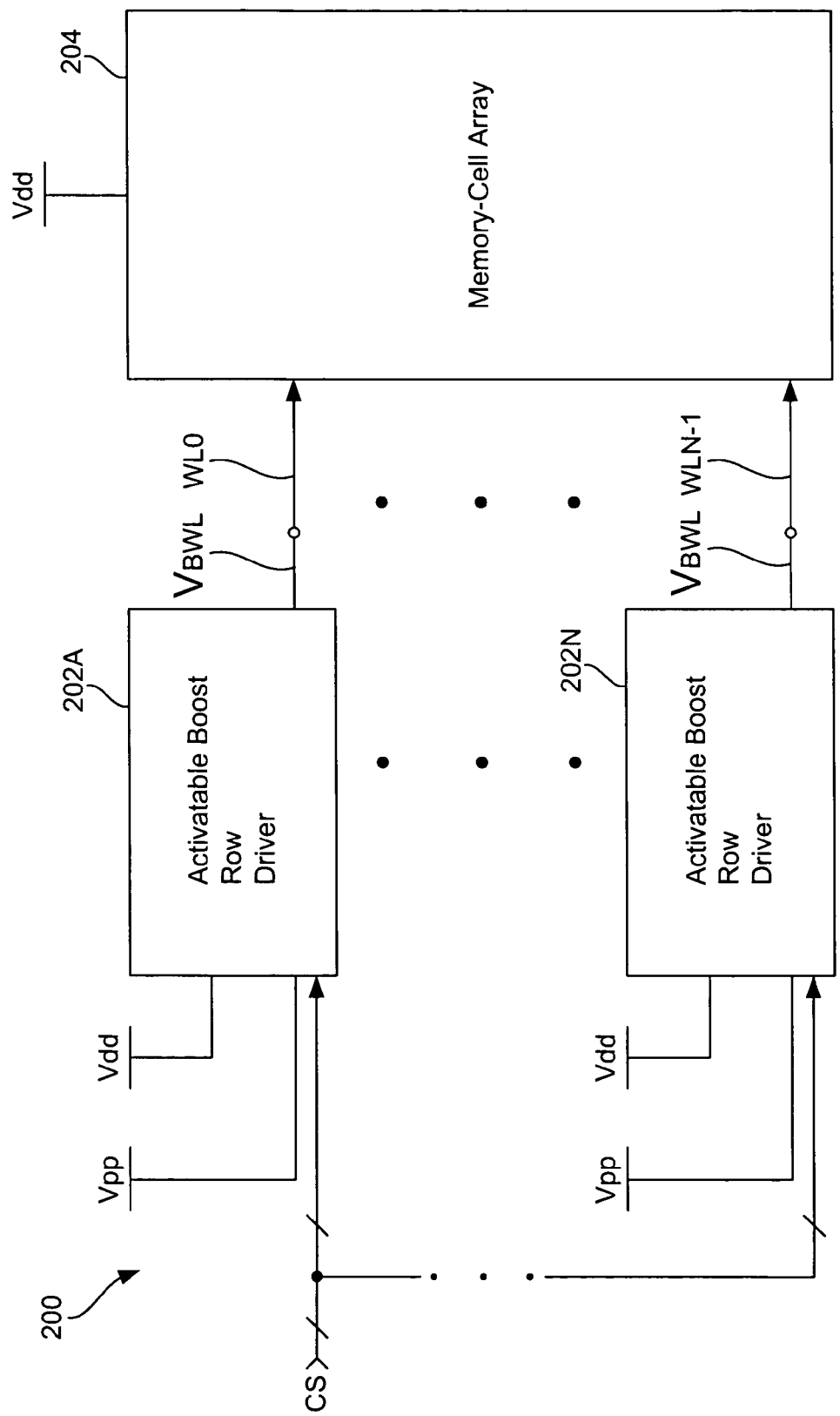
FIG. 2 is a functional block diagram of a portion of DRAM including a plurality of activatable boost row drivers that either boost a pumped voltage or provide that pumped voltage directly on a corresponding word line according to one embodiment of the present invention.

FIG. 2 is a functional block diagram of a portion of a DRAM 200 including a plurality of activatable boost row drivers 202A-N, each activatable boost row driver provides a boosted word line voltage $V_{BWL}$ having either a value equal to a magnitude of a pumped supply voltage Vpp or a "boosted" value greater than the magnitude of the pumped supply voltage according to one embodiment of the present invention. The boosted word line voltage $V_{BWL}$ from each row driver 202A-N is applied to a corresponding word line WL0-WLN-1 of a memory-cell array 204 to access memory cells (not shown) in the array connected to that word line. Each activatable boost row driver 202A-N compares the pumped supply voltage Vpp to a supply voltage Vdd in determining whether to provide the boosted word line voltage $V_{BWL}$ having the value of the pumped supply voltage Vpp or the boosted value greater than the pumped supply voltage. The activatable boost row drivers 202A-N provide the boosted value only when required for proper operation of the memory-cell array 204 and in this way eliminate the application of higher than necessary voltages to components in the array. This prevents unnecessary stress of such components and increases the operable life of the components along with the operational life of the DRAM 200 and any system containing the DRAM.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Also, the operation of well known components and/or processes has not been shown or described in detail below to avoid unnecessarily obscuring the present invention. Finally, in the present description, the activatable boost row drivers 202 are described as generating the boosted voltage having a value greater than the supply voltage Vpp. Although this voltage is described as a "boosted" voltage in the present description, the voltage corresponds generally to any voltage having the required magnitude no matter how generated, whether through a boost circuit, a charge pump, or some other suitable voltage increasing circuit.

Figure 1:
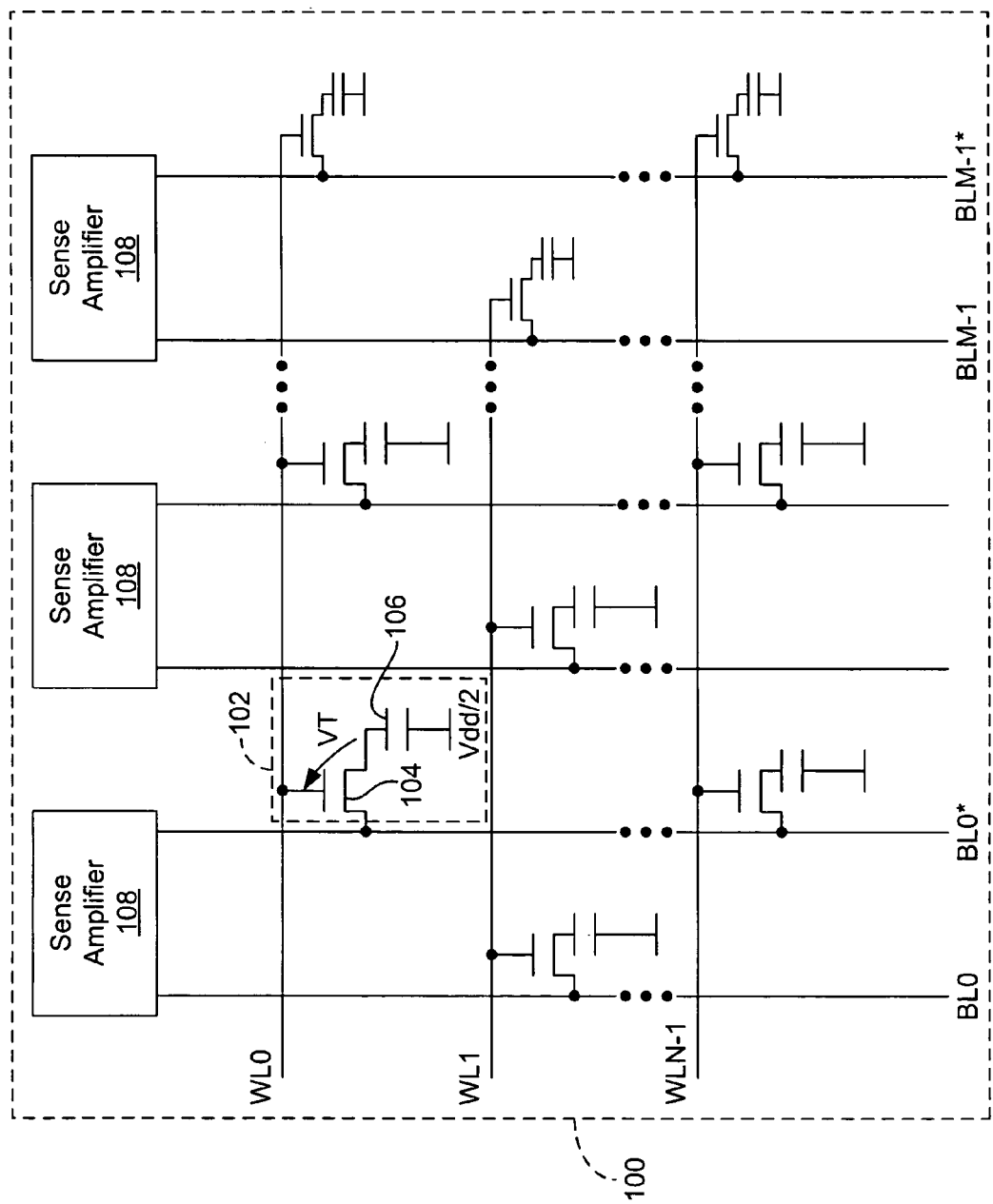
FIG. 1 is a schematic block diagram of a conventional DRAM memory-cell array.

Each of the activatable boost row drivers 202A-N receives a plurality of control signals CS that control a mode of operation of each of the activatable boost row drivers. Each row driver 202A-N operates in either a deselected mode or a sense and restore mode in response to the control signals CS. In the deselected mode, each row driver 202A-N drives the voltage on the corresponding word line WL to approximately ground. In the sense and restore mode, each row driver 202 applies the boosted word line voltage $V_{BWL}$ to the corresponding word line WL. The control signals CS include address signals generated by address decode circuitry (not shown) in the DRAM 200, with these address signals selecting one of the row drivers 202A-N and deselecting all others. These address signals indicate an addressed row of memory cells in the memory-cell array 204 and activate the row driver 202A-N connected to the word line WL0-WLN-1 associated with this addressed row of memory cells. The memory-cell array 204 also receives the supply voltage Vdd to power components in the array, such as sense amplifiers as previously described. The memory-cell array 204 has the same structure and operates in the same way as the array 100 of FIG. 1, and thus, for the sake of brevity, such structure and operation will not again be described in detail.

During a read operation, the control signals CS are applied to the activatable boost row drivers 202A-N to activate one of these drivers and place that activated driver in the sense and restore mode of operation. All other activatable boost row drivers 202A-N remain deselected in response to the control signals CS, with the deselected row drivers 202B-N driving their associated word lines WL inactive low to turn OFF the rows of memory cells connected to these word lines. The address signals contained in the control signals CS select the row driver 202A-N connected to the word line WL associated with the addressed row of memory cells in the array 204. In the following description, assume that the addressed row of memory cells corresponds to the row connected to the word line WL0, meaning that the activatable boost row driver 202A is selected and all other row drivers 202B-N are deselected in response to the control signals CS.

During a read operation, the boost row driver 202A, which is the row driver associated with the addressed row of memory cells connected to the word line WL0, operates in the sense and restore mode. The control signals CS control the row driver 202A to place the driver in the proper mode of operation. During the sense and restore mode of operation, the row driver 202A the row driver 202A compares the magnitude of the pumped supply voltage Vpp to the magnitude of the supply voltage Vdd. When the magnitude of the pumped supply voltage Vpp is greater than or equal to the sum of the magnitude of the supply voltage Vdd plus the threshold voltage VT of the access transistors (not shown) in the memory cells (not shown) in the array 204, the row driver 202A applies the pumped supply voltage Vpp on the word line WL0 as the boosted word line voltage $V_{BWL}$. Otherwise, the row driver 202A provides the boosted word line voltage $V_{BWL}$ on the word line WL0 having a magnitude that is greater than the magnitude of the pumped supply voltage Vpp. Thus, if |Vpp|>|Vdd|+|VT| then the activated row driver 202A drives the word line WL0 directly with the pumped supply voltage Vpp, and otherwise drives this word line with a voltage having a magnitude that is greater than the magnitude of the pumped supply voltage. In response to the boosted word line voltage $V_{BWL}$ that the row driver 202A applies on the word line WL0, the memory cells connected to this word line are selected and sense amplifiers (not shown) in the array 204 sense and restore the data in these selected memory cells.

The drivers 202 are described as driving the voltage on the corresponding word line WL to either ground or the boosted word line voltage $V_{BWL}$. In another embodiment, however, each driver 202 operates in an independent sense mode of operation during which the driver applies the supply voltage Vdd on the word line while data is being sensed from the corresponding row of memory cells in the array 204. Each driver 202 thereafter operates in an independent restore mode during which the driver applies the boosted word line voltage $V_{BWL}$ on the word line WL to restore the sensed data.

The activatable boost row drivers 202A-N ensure that the data stored in the addressed memory cells is properly restored, as previously described. Thus, in the present example the row driver 202A drives the word line WL0 with the boosted word line voltage $V_{BWL}$ having a magnitude sufficient to ensure that the data stored in the memory cells connected to this word line is properly restored. Note that with the row drivers 202A-N, the magnitude of the boosted word line voltage $V_{BWL}$ is only made greater than the magnitude of the pumped supply voltage Vpp when necessary to ensure the proper restoration of data in the addressed memory cells. In this way, the row drivers 202A utilize the pumped supply voltage Vpp directly as the boosted word line voltage $V_{BWL}$ when possible and only provide a boosted word line voltage having a greater magnitude when required. This reduces the stress placed on components, such as access transistors, in the memory-cell array 204 thereby increasing the operable life of the array and the DRAM 200.

Figure 3:
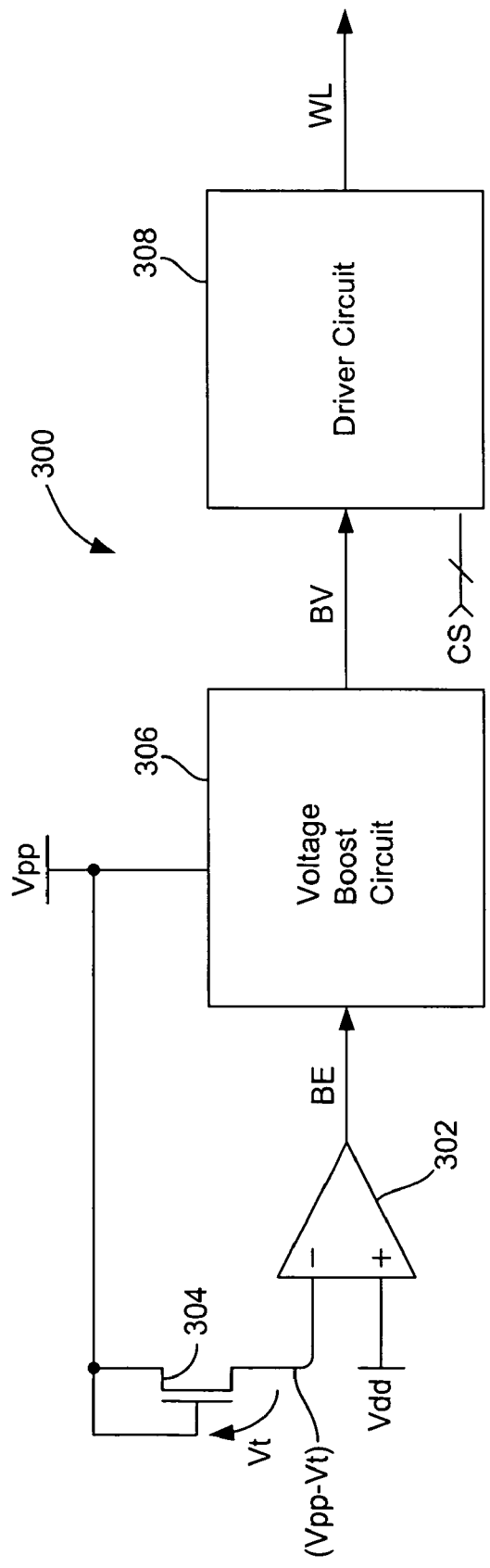
FIG. 3 is a more detailed functional block diagram of one of the activatable boost row drivers of FIG. 2 according to one embodiment of the present invention.

FIG. 3 is a more detailed functional block diagram of an activatable boost row driver 300 corresponding to one of the activatable boost row drives 202A-N of FIG. 2 according to one embodiment of the present invention. The row driver 300 includes a comparator 302 that receives the supply voltage Vdd on a noninverting input and the pumped supply voltage Vpp applied through a diode-coupled NMOS transistor 304 on an inverting input. The diode-coupled NMOS transistor 304 has a threshold voltage VT that is equal to the threshold voltages of the access transistors contained in the memory-cell array 204 of FIG. 2. The transistor 304 has the same physical characteristics as the access transistors, such as channel width and length and doping concentrations in the source and drain regions. In this way, the electrical characteristics of the transistor 304 are the same as the electoral characteristics of the access transistors.

In response to the voltages on its two inputs, the comparator 300 generates a boost enable signal BE. When the supply voltage Vdd on the noninverting input is greater than the pumped supply voltage Vpp minus the threshold voltage VT (i.e., Vpp−VT) on the inverting input, the comparator 302 drives the boost enable signal BE active. Conversely, when the supply voltage Vdd on the noninverting input is less than (Vpp−VT) on the inverting input, the comparator 302 drives the boost enable signal BE inactive. In this way, the comparator 302 generates the active boost enable signal BE when boosting of the pumped supply voltage Vpp is required to ensure proper restoration of data in the memory-cell array 204 (FIG. 2). When no boosting of the pumped supply voltage Vpp is required to ensure proper restoration of data, the comparator 302 deactivates the boost enable signal BE. The comparator 302 simply implements the equation Vpp<Vdd+VT, which may be rewritten as Vdd>Vpp−VT. From this equation, when the supply voltage Vdd is greater than (Vpp−VT) then boosting of the pumped supply voltage Vpp is required and the comparator 302 activates the BE signal. If Vdd is less than (Vpp−VT) then no boosting of the pumped supply voltage Vpp is required and the comparator deactivates the BE signal.

A voltage boost circuit 306, such as a charge pump, generates a boosted voltage BV from the pumped supply voltage Vpp, with the magnitude of the boosted voltage having a value that depends on the state of the BE signal. The voltage boost circuit 306 outputs the pumped supply voltage Vpp in response to the inactive BE signal. When the BE signal is active, the voltage boost circuit 306 generates the boosted voltage BV having a magnitude that is greater than the magnitude of the pumped supply voltage Vpp. In the embodiment, the boosted voltage BV has a magnitude equal to the pumped supply voltage Vpp plus a constant C when the BE signal is active. The boost circuit 306 thus provides either the pumped supply voltage Vpp as the boosted voltage BV or provides the boosted voltage BV having a value (Vpp+C). In this way, if no boosting of the voltage Vpp is required for proper restoration of data in the array 204 (FIG. 2) while this voltage is boosted if required to ensure proper operation.

A driver circuit 308 receives the boosted voltage BV and drives an associated word line WL with the appropriate voltage in response to the control signals CS. The voltage applied on the word line WL depends on the mode of operation of the row driver 300. When the control signals CS place the row driver 300 in the sense and restore mode of operation, the driver circuit 308 supplies the boosted voltage BV on the word line WL. In the embodiment of FIG. 3, each row driver 300 is shown as including an individual voltage boost circuit 306. In another embodiment, a single voltage boost circuit 306 supplies the boosted voltage BV to all of the row drivers 300 or groups of such row drivers. For the row drivers 300 associated with a given memory-cell array 204 (FIG. 2), only one of these drivers is activated at any given time. As a result, utilizing a single voltage boost circuit 306 to supply the required boosted voltage BV to all row drivers 300 eliminates duplication of circuitry and saves space in the integrated circuit containing the row drivers. In another embodiment of the row driver 300, the driver circuit 308 further receives the supply voltage Vdd and operates in a sense mode to apply the supply voltage Vdd on the word line WL and operates in a restore mode to supply the supply voltage Vpp on the word line WL. These independent sense and restore modes are determined responsive to the control signals CS applied to the driver circuit 308.

Figure 4:
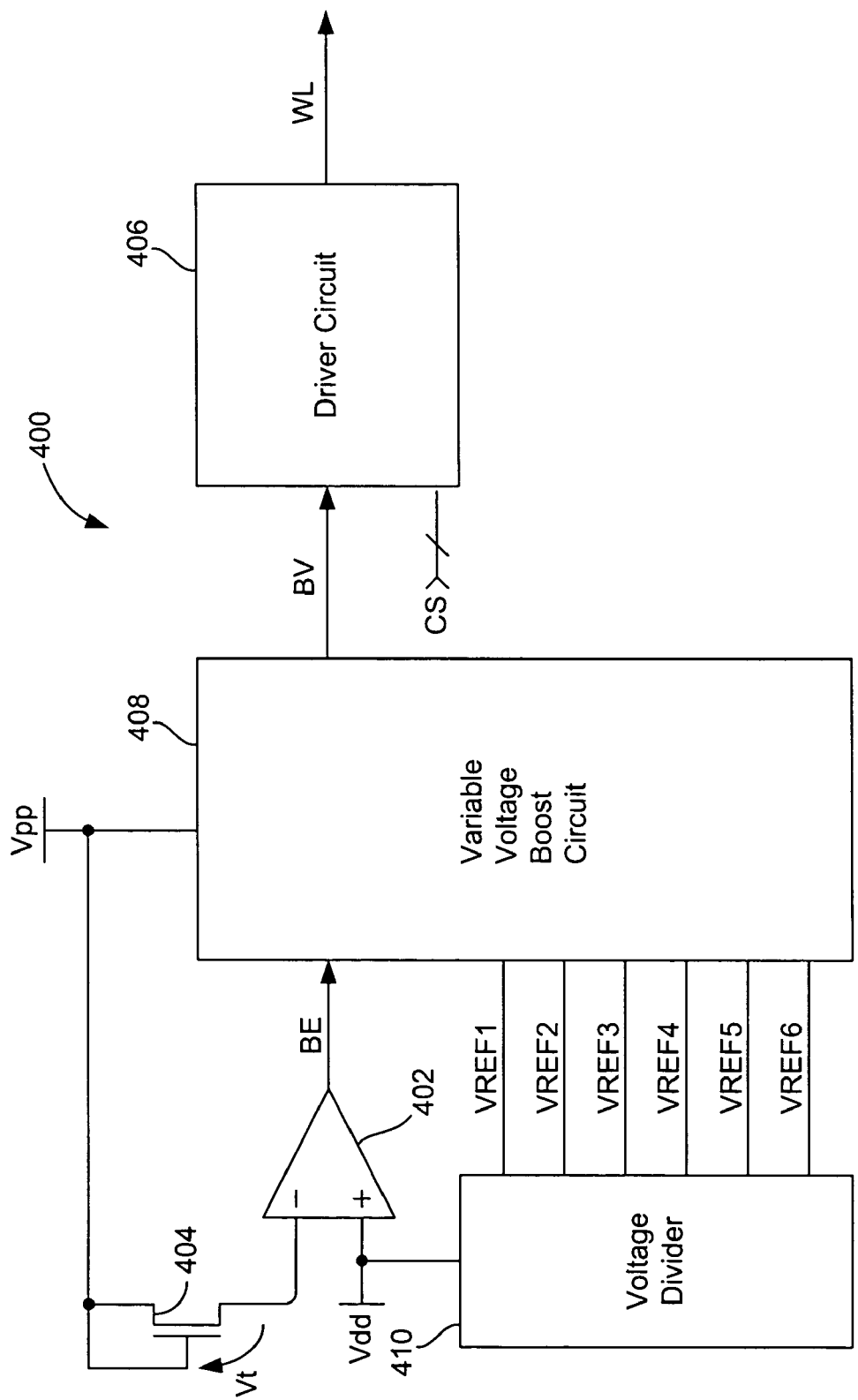
FIG. 4 is a more detailed functional block diagram of one of the activatable boost row drivers of FIG. 2 according to another embodiment of the present invention.

FIG. 4 is a more detailed functional block diagram of an activatable boost row driver 400 corresponding to one of the activatable boost row drives 202A-N of FIG. 2 according to another embodiment of the present invention. The row driver 400 includes a comparator 402, a diode-coupled transistor 404, and a driver circuit 406 that operate in the same way as the corresponding components 302, 304, and 308 in FIG. 3. Thus, for the sake of brevity, the operation of the components 402-406 will not be described in detail. In response to the BE signal from the comparator 402, a variable voltage boost circuit 408 provides a boost voltage BV having a variable boost value when boosting of the pumped supply voltage Vpp is required. More specifically, when the comparator drives the BE signal inactive, the variable voltage boost circuit 408 provides the pumped supply voltage Vpp as the boosted voltage BV. When the BE signal is active, however, the variable voltage boost circuit 408 provides the boosted voltage BV having a magnitude that is a function of the supply voltage Vdd.

A voltage divider 410 generates number of reference voltages VREF1-VREF6, each having a value that is a function of the supply voltage Vdd. The references VREF1-VREF6 also have values that sequentially decrease, with the reference voltage VREF1 having a value that is less than the supply voltage Vdd but greater than the value of the voltage VREF2. The reference voltage VREF2 has a value that is less than the voltage VREF1 but greater than the reference voltage VREF3, and so on for the remaining reference voltages VREF4-VREF6. The reference voltages VREF1-VREF6 have respective values that vary as the supply voltage Vdd varies. In response to the reference voltages VREF1-VREF6, the variable voltage boost circuit 408 generates the boosted voltage BV having a value that is a function of the values of these reference voltages and thereby a function of the supply voltage Vdd. This allows the boost circuit 408 to adjust the amount by which the pumped voltage Vpp is boosted and to generate a value for the boosted voltage BV that is not greater than that required to ensure proper restoration of data.

In operation, the variable voltage boost circuit 408 determines whether each of the reference voltages VREF1-VREF6 is greater than a threshold value. Each reference voltage VREF1-VREF6 has a threshold value when the supply voltage Vdd equals a corresponding value. For example, in one embodiment each reference voltage signal VREF1-VREF6 sequentially equals the threshold value as the supply voltage Vdd varies from 3 volts to 3.6 volts. In this embodiment, when the supply voltage Vdd equals 3.05 volts the reference voltage VREF1 equals the threshold voltage, and when the supply voltage equals 3.15 volts the reference voltage signal VREF2 equals the threshold voltage, and so on for the remaining reference voltage signals with the reference voltage VREF<6> being equal to the threshold voltage when the supply voltage equals 3.55 volts.

The variable voltage boost circuit 408 generates the boosted voltage BV having a value that is a function of the number of the reference voltages VREF1-VREF6 that exceed the threshold value. As the supply voltage Vdd increases, the value of the boosted voltage BV required to ensure that BV>Vdd+VT increases. Conversely, as the supply voltage Vdd decreases the value of the boosted voltage BV required to ensure that BV>Vdd+VT decreases accordingly. The variable voltage boost circuit 408 exploits this fact and provides the boosted voltage BV having a value that ensures proper data restoration but that is not too much greater than required. For example, if a fixed boost value such as the constant C discussed with reference to the voltage boost circuit 306 of FIG. 3 is provided, then the value for C must ensure proper operation when Vdd equals 3.05 volts and when Vdd equals 3.55 volts. Thus, when the supply voltage Vdd equals 3.05 volts the boosted voltage BV has a value that is greater than necessary and that places stress on components in the array 204 (FIG. 2) as previously discussed. With the variable voltage boost circuit 408, as the supply voltage Vdd varies through some allowable range the circuit adjusts the value of the boosted voltage BV to ensure proper operation and to adjust the value of the boosted voltage required for such proper operation to thereby reduce the stress placed on components in the array 204.

The overall operation of the row driver 400 is similar to that described for the row driver 300 of FIG. 3, and thus, for the sake of brevity, will not again be described in detail. Also note that the circuit 408 would typically involve more circuitry than the circuit 306 of FIG. 3 while the circuit 408 reduces stress on components in the array 204. Thus, each of the circuits 306 and 408 may have unique advantages in different applications. One skilled in the art will understand suitable circuitry for forming the components 302-308 in the embodiment of FIG. 3 and the components 402-410 in embodiment of FIG. 4. Notwithstanding this fact, a more detailed description of one embodiment of the variable voltage boost circuit 408 is described in U.S. patent application Ser. No. 10/944,498 filed on Sep. 16, 2004 to Worley et aL, entitled VARIABLE BOOST VOLTAGE ROW DRIVER CIRCUIT AND METHOD, AND MEMORY DEVICE AND SYSTEM INCLUDING SAME, which is incorporated herein by reference.

Figure 5:
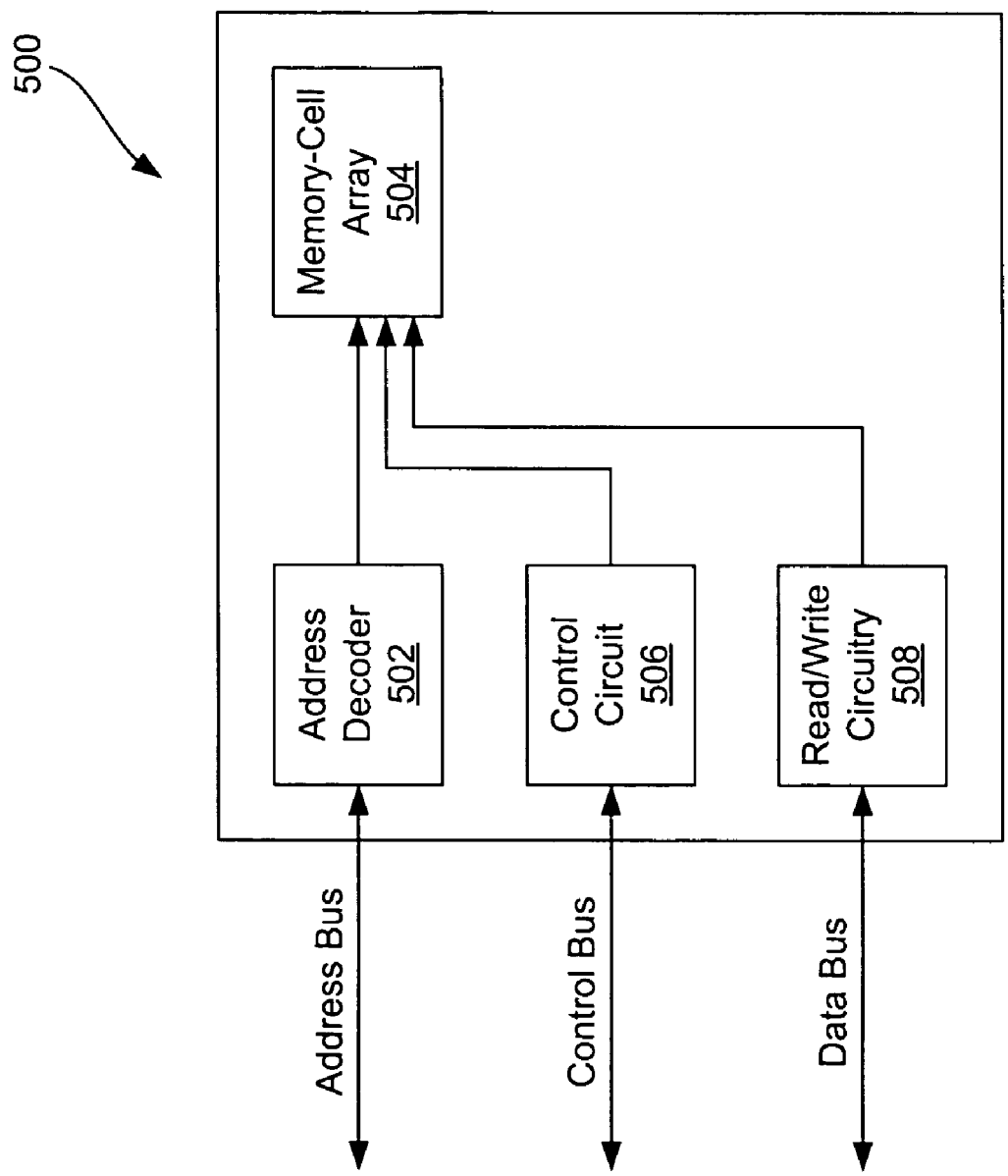
FIG. 5 is a functional block diagram of a memory device including the activatable row drivers and memory-cell array of FIG. 2 according to one embodiment of the present invention.

FIG. 5 is a functional block diagram of a memory device 500 including the row drivers 202 of FIG. 2 contained in an address decoder 502 of the memory device according to one embodiment of the present invention. The address decoder 502 is connected to an address bus to receive address signals and is operable to decode these address signals and apply the decoded address signals to a memory-cell array 504. A control circuit 506 is connected to a control bus to receive control signals applied to the memory device 500 and to generate a plurality of control signals in response to these applied control signals. The control signals generated by the control circuit 506 are applied to various components in the memory device 500 to control the overall operation of the device. Read/write circuitry 508 is connected to a data bus and operates to transfer data between the data bus and the memory-cell array 504.

In operation, external circuitry (not shown) provides address, control, and data signals on the respective busses to the memory device 500. During a read operation, the external circuitry provides a memory address on the address bus and control signals on the control bus. In response to the memory address on the address bus, the address decoder 502 provides a decoded memory address to the memory-cell array 504 and the row drivers 202 (not shown) in the decoder operate as previously described to activate the addressed word line in the memory-cell array during the sense and store modes of operation. The control circuit 506 provides control signals to the memory-cell array 504 in response to the control signals on the control bus. The control signals from the control circuit 506 control the memory-cell array 504 to provide read data stored in the addressed memory cells connected to the addressed word line to the read/write circuitry 508. The read/write circuitry 508 then provides this data on the data bus for use by the external circuitry. During a write cycle, the external circuitry provides a memory address on the address bus, control signals on the control bus, and data on the data bus. Once again, the address decoder 502 decodes the memory address on the address bus and provides a decoded address to the memory-cell array 504 and the row drivers 202 operate as previously described to activate the addressed word line in the memory-cell array. The read/write circuitry 508 provides the data on the data bus to the memory-cell array 504 and this data is stored in the addressed memory cells in the memory-cell array under control of the control signals from the control circuit 506. The memory device 500 may be any of a variety of different types of memory device, such as a DRAM, SDRAM, DDR DRAM, SLDRAM, and RAMBUS DRAM, and FLASH memory device. Moreover, the row drivers 202 may be formed in integrated circuits other than memory devices but which require boosted voltages. Moreover, the row drivers 202 can be contained in address decode circuitry in a DRAM or an ASIC including a DRAM, or the row drivers can be contained in other circuitry within the DRAM or ASIC as well.

Figure 6:
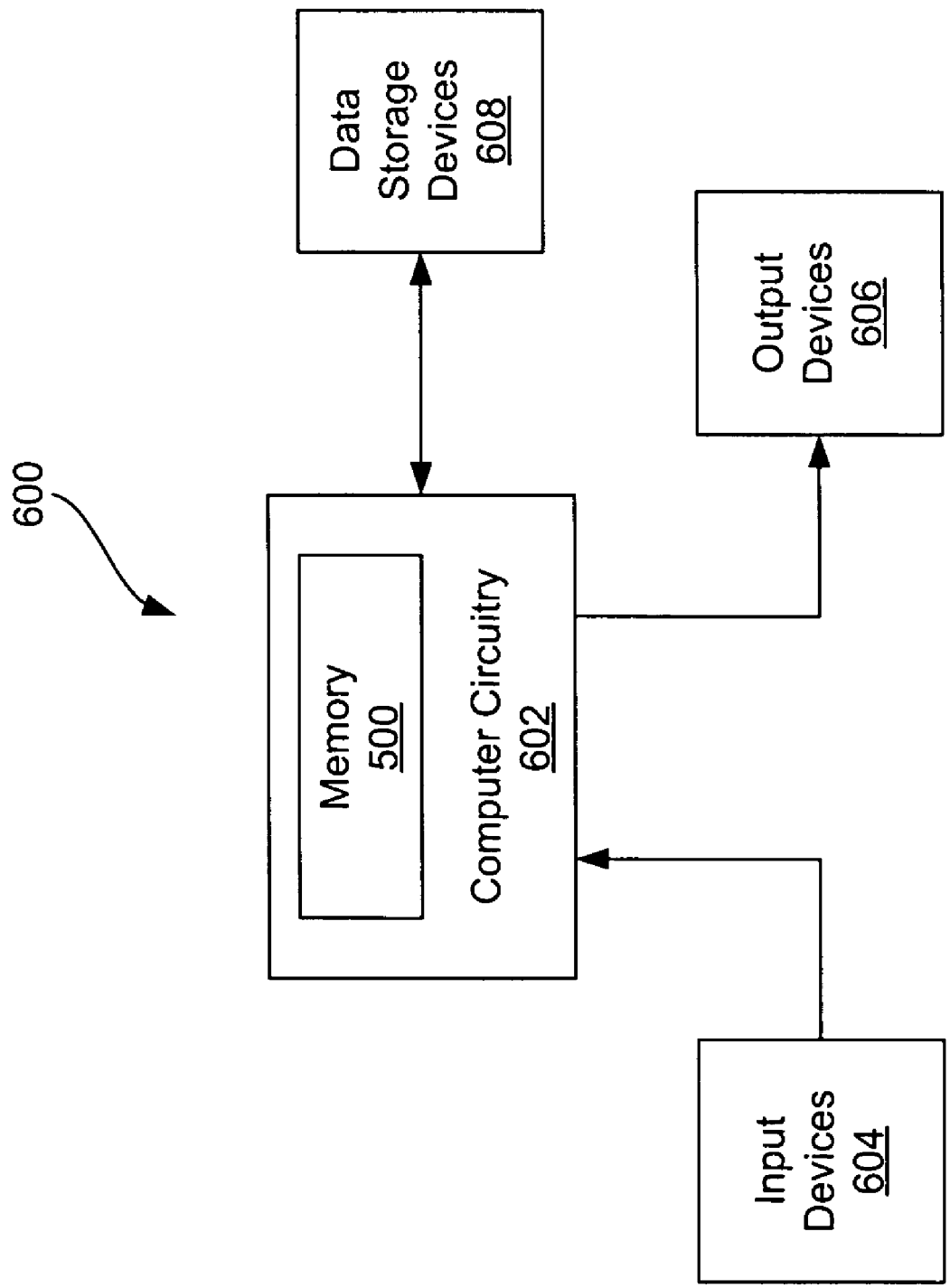
FIG. 6 is a functional block diagram of a computer system including the memory device of FIG. 5 according to one embodiment of the present invention.

FIG. 6 is a functional block diagram of a computer system 600 including the memory device 500 of FIG. 5 according to another embodiment of the present invention. The computer system 600 includes computer circuitry 602 that contains the memory device 500. Typically, the computer circuitry 602 is connected through address, data, and control buses to the memory device 500 to provide for writing data to and reading data from the memory device. The computer circuitry 602 includes circuitry for performing various computing functions, such as executing specific software to perform specific calculations or tasks. In addition, the computer system 600 includes one or more input devices 604, such as a keyboard or a mouse, connected to the computer circuitry 602 to allow an operator to interface with the computer system. Typically, the computer system 600 also includes one or more output devices 606 connected to the computer circuitry 602, such output devices typically including a printer and a video terminal. One or more data storage devices 608 are also typically connected to the computer circuitry 602 to store data or retrieve data from external storage media (not shown). Examples of typical storage devices 608 include hard and floppy disks, tape cassettes, compact disk read-only (CD-ROMs) and compact disk read-write (CD-RW) memories, and digital video disks (DVDs).

Even though various embodiments and advantages of the present invention have been set forth in the foregoing description, the above disclosure is illustrative only, and changes may be made in detail and yet remain within the broad principles of the present invention. Moreover, the functions performed by various components may be combined to be performed by fewer elements, separated and performed by more elements, or combined into different functional blocks depending upon design considerations for the device or system being implemented, as will appreciated by those skilled in the art. Therefore, the present invention is to be limited only by the appended claims.

What is claimed is:

1. A row driver circuit contained in an integrated circuit adapted to receive a first external supply voltage and a second external supply voltage, each of the first and second external supply voltages being external to the integrated circuit and the row driver circuit configured to:
   provide during read and write operations the first external supply voltage on an output responsive to the first external supply voltage being greater than a threshold value derived from the second external supply voltage;
   generate a plurality of reference voltages that are derived from the second external supply voltage;
   generate a boosted voltage from at least one of the plurality of reference voltages and that is greater than the first external supply voltage; and
   provide during read and write operations that boosted voltage on the output responsive to the first external supply voltage being less than the threshold value.

2. The row driver of claim 1 wherein the boosted voltage is greater than the first external supply voltage by a variable value.

3. The row driver of claim 1 wherein the boosted voltage is greater than the first external supply voltage and has a value, and wherein the value of the boosted voltage is a function of the second external supply voltage.

4. The row driver of claim 3 wherein the first external supply voltage corresponds to a pumped supply voltage Vpp and wherein the second external supply voltage corresponds to a supply voltage Vdd.

5. The row driver of claim 1 wherein the threshold value equals a magnitude of the second external supply voltage plus a transistor threshold value.

6. The row driver of claim 1 wherein the row driver is further configured to generate a boost enable signal, the boost enable signal being inactive responsive to the first external supply voltage being greater than or equal to the threshold value and the boost enable signal being active responsive to the first external supply voltage being less than the threshold value, and wherein the driver provides the boosted voltage on the output responsive to the boost enable signal being active.

7. A row driver circuit contained in an integrated circuit adapted to receive a first external supply voltage and a second external supply voltage, each of the first and second external supply voltages being external to the integrated circuit and the row driver circuit configured to;
   provide during read and write operations the first external supply voltage on an output responsive to a magnitude of the first external supply voltage being greater than a threshold value plus a magnitude of the second external supply voltage;
   generate a boosted voltage having a magnitude that is greater than the magnitude of the first external supply voltage by an amount that is proportional to a difference between the magnitude of the first external supply voltage and the magnitude of the second external supply voltage; and
   provide during read and write operations that boosted voltage on the output responsive to the magnitude of the first external supply voltage being less than the threshold value plus the magnitude of the second external supply voltage.

8. The row driver of claim 7 wherein the magnitude of the boosted voltage is greater than the magnitude of the first external supply voltage by a variable value.

9. The row driver of claim 7 further comprising:
   a compare circuit adapted to receive the second external supply voltage and to receive a reference voltage that is equal to the first external supply voltage minus the threshold value, the comparing circuit operable to generate an active boost enable signal responsive to the magnitude of the second external supply voltage being greater than the reference voltage and operable to generate an inactive boost enable signal responsive to the magnitude of the second external supply voltage being less than the reference voltage;
   a voltage boost circuit coupled to the compare circuit and operable to generate the boosted voltage having a magnitude greater than the magnitude of the first external supply voltage responsive to the active boost enable signal and operable to provide the first external supply voltage responsive to the inactive boost enable signal; and
   a driver circuit coupled to the voltage boost circuit and including an output adapted to be coupled to a word line, the driver circuit operable to provide either the boosted voltage or the first external supply voltage on the output responsive to control signals.

10. The row driver of claim 9 wherein the compare circuit comprises a comparator.

11. The row driver of claim 9 wherein the voltage boost circuit comprises a charge pump circuit.

12. The row driver of claim 7 further comprising:
   a compare circuit adapted to receive the second external supply voltage and to receive a reference voltage that is equal to the first external supply voltage minus the threshold value, the comparing circuit operable to generate an active boost enable signal responsive to the magnitude of the second external supply voltage being greater than the reference voltage and operable to generate an inactive boost enable signal responsive to the magnitude of the second external supply voltage being less than the reference voltage;
   a variable voltage boost circuit coupled to the compare circuit and adapted to receive a plurality of reference voltage signals derived from the second external supply voltage, the variable voltage boost circuit operable to generate the boosted voltage having a magnitude greater than the magnitude of the first external supply voltage responsive to the active boost enable signal, with the magnitude of the boosted voltage being a function of values of the reference voltage signals, and the variable voltage boost circuit operable to provide the first external supply voltage responsive to the inactive boost enable signal; and a driver circuit coupled to the voltage boost circuit and including an output adapted to be coupled to a word line, the driver circuit operable to provide either the boosted voltage or the first external supply voltage on the output responsive to control signals.

13. The row driver of claim 12 further comprising a voltage divider adapted to receive the second external supply voltage and operable to derive the plurality of reference voltage signals from the second external supply voltage, each reference voltage signal having a value that is a function of the magnitude of the second external supply voltage.

14. The row driver of claim 12 wherein the compare circuit comprises a comparator.

15. The row driver of claim 12 wherein the voltage boost circuit comprises a charge pump circuit.

16. The row driver of claim 7 wherein the row driver is operable in a restore mode to provide either the first external supply voltage or the boosted voltage on the output, and is further operable in a sense mode to provide the second external supply voltage on the output.

17. A memory device, comprising:
a memory-cell array including a plurality of memory cells and a plurality of word lines, each memory cell being coupled to an associated word line;
read/write circuitry coupled to a data bus and the memory-cell array;
control circuitry coupled between a control bus and the memory-cell array; and
address decoder circuitry coupled to an address bus and to the memory-cell array, the address decoder circuitry including a row driver circuit adapted to receive a first external supply voltage and a second external supply voltage supplied to the memory device, and the address decoder circuitry configured to;
provide during read and write operations the first external supply voltage on one of the word lines responsive to the first external supply voltage being greater than or equal to a threshold value,
generate a plurality of reference voltages that are derived from the second external supply voltage,
generate a boosted voltage from at least one of the plurality of reference voltages and that is greater than the first external supply voltage, and
provide during read and write operations that boosted voltage on the word line responsive to the first external supply voltage being less than the threshold value.

18. The memory device of claim 17 wherein the memory-cell array comprises an array of dynamic random access memory cells.

19. The memory device of claim 17 wherein the boosted voltage is greater than the first external supply voltage by a variable value.

20. The memory device of claim 17 wherein the boosted voltage is greater than the first external supply voltage, and wherein the boosted voltage has a value that is a function of the second external supply voltage.

21. A computer system, comprising:
a data input device;
a data output device;
computer circuitry coupled to the data input and output devices; and
a memory device coupled to the computer circuitry, the memory device including,
a memory-cell array including a plurality of memory cells and a plurality of word lines, each memory cell being coupled to an associated word line;
read/write circuitry coupled to a data bus and the memory-cell array;
control circuitry coupled between a control bus and the memory-cell array; and
address decoder circuitry coupled to an address bus and to the memory-cell array, the address decoder circuitry including a row driver circuit adapted to receive a first external supply voltage and a second external supply voltage and configured to:
provide during read and write operations the first external supply voltage on one of the word lines responsive to the first external supply voltage being greater than or equal to a threshold value,
generate a plurality of reference voltages that are derived from the second external supply voltage,
generate a boosted voltage from at least one of the plurality of reference voltages and that is greater than the first external supply voltage, and
provide during read and write operations that boosted voltage on the word line responsive to the first external supply voltage being less than the threshold value.

22. The computer system of claim 21 wherein the memory device comprises a DRAM.

23. The computer system of claim 21 further comprising at least one data storage device coupled to the computer circuitry.

24. A method of generating a boosted voltage in an integrated circuit and accessing stored data in the integrated circuit using the boosted voltage, the method comprising:
determining whether a magnitude of a first supply voltage external to the integrated circuit is greater than a threshold value plus a magnitude of a second supply voltage external to the integrated circuit;
when the magnitude of the first supply voltage external to the integrated circuit is determined to be greater than the threshold value plus the magnitude of the second supply voltage external to the integrated circuit,
generating the boosted voltage having a magnitude equal to the magnitude of the first supply voltage external to the integrated circuit;
generating a plurality of reference voltages that are derived from the second supply voltage external to the integrated circuit;
determining whether the magnitude of the first supply voltage external the integrated circuit is less than the threshold value plus the magnitude of the second supply voltage external to the integrated circuit; and
when the magnitude of the first supply voltage external to the integrated circuit is determined to be less than the threshold value plus the magnitude of the second supply voltage external to the integrated circuit,
generating the boosted voltage from at least one of the plurality of reference voltages and having a magnitude that is greater than the magnitude of the first supply voltage external to the integrated circuit; and
using the boosted voltage during read and write accesses of the stored data in the integrated circuit.

25. The method of claim 24 wherein generating the boosted voltage having a magnitude that is greater than the magnitude of the first supply voltage external to the integrated circuit comprises deriving the boosted voltage from the first supply voltage external to the integrated circuit.

26. The method of claim 24 wherein generating the boosted voltage having a magnitude that is greater than the magnitude of the first supply voltage external the integrated circuit comprises generating the boosted voltage having a magnitude that is a variable amount greater than the magnitude of the first supply voltage external to the integrated circuit.

27. The method of claim 24 wherein generating the boosted voltage having a magnitude that is greater than the magnitude of the first supply voltage external to the integrated circuit comprises generating the boosted voltage having a magnitude that is a function of the magnitude of the second supply voltage external the integrated circuit.

28. A method of generating a boosted word line voltage to access addressed memory cells in a dynamic random access memory, the memory-cell array including a plurality of word lines and a plurality of access transistors, each access transistor having an associated threshold value, and the method comprising:

determining whether a magnitude of a pumped supply voltage is greater than or equal to the threshold value plus a magnitude of a lower supply voltage, the pumped supply voltage and the lower supply voltage both being supply voltages generated external to the dynamic access memory;

when the magnitude of the pumped supply voltage is greater than or equal to the threshold value plus the magnitude of the lower supply voltage, generating the boosted word line voltage having a magnitude that is equal to-the magnitude of the pumped supply voltage;

when the magnitude of the pumped supply voltage is less than the threshold value plus the magnitude of the lower supply voltage, generating the boosted word line voltage having a magnitude that is greater than the magnitude of the pumped supply voltage by an amount that is proportional to a difference between the magnitude of the pumped supply voltage and the magnitude of the lower supply voltage; and during read and write operations, applying the boosted word line voltage on a word line associated with the addressed memory cells.

29. The method of claim 28 wherein generating the boosted word line voltage having a magnitude that is greater than the magnitude of the pumped supply voltage comprises generating the boosted word line voltage having a magnitude that is a variable amount greater than the magnitude of the pumped supply voltage.

30. The method of claim 28 wherein generating the boosted word line voltage having a magnitude that is greater than the magnitude of the pumped supply voltage comprises generating the boosted word line voltage having a magnitude that is a function of the magnitude of the lower supply voltage.

* * * * *